US010998193B1

(12) United States Patent
Philip et al.

(10) Patent No.: US 10,998,193 B1
(45) Date of Patent: May 4, 2021

(54) SPACER-ASSISTED LITHOGRAPHIC DOUBLE PATTERNING

(71) Applicant: INTERNATIONAL BUSINESS MACHINES CORPORATION, Armonk, NY (US)

(72) Inventors: Timothy Mathew Philip, Albany, NY (US); Somnath Ghosh, Clifton Park, NY (US); Daniel James Dechene, Watervliet, NY (US); Robert Robison, Rexford, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/748,898

(22) Filed: Jan. 22, 2020

(51) Int. Cl.
| | |
|---|---|
| *H01L 21/033* | (2006.01) |
| *H01L 21/311* | (2006.01) |
| *H01L 21/02* | (2006.01) |
| *H01L 21/027* | (2006.01) |
| *H01L 21/306* | (2006.01) |
| *H01L 21/3213* | (2006.01) |

(52) U.S. Cl.
CPC ...... *H01L 21/0337* (2013.01); *H01L 21/0226* (2013.01); *H01L 21/0273* (2013.01); *H01L 21/02175* (2013.01); *H01L 21/0332* (2013.01); *H01L 21/30604* (2013.01); *H01L 21/31111* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 8,987,142 B2 | 3/2015 | Lee et al. | |
| 8,992,792 B2 | 3/2015 | Chang et al. | |
| 9,564,446 B1* | 2/2017 | Weybright | H01L 27/1104 |
| 9,773,676 B2 | 9/2017 | Chang et al. | |
| 9,941,164 B1* | 4/2018 | Kim | H01L 21/3083 |
| 9,991,156 B2 | 6/2018 | Burnes et al. | |
| 10,157,789 B2 | 12/2018 | Chen et al. | |
| 2015/0200110 A1 | 7/2015 | Li et al. | |
| 2018/0204723 A1 | 7/2018 | Chen et al. | |
| 2018/0323067 A1* | 11/2018 | Shu | H01L 23/5256 |

(Continued)

OTHER PUBLICATIONS

Sun, L. et al., "Line edge roughness frequency analysis for SAQP process" Proceedings of SPIE (Mar. 2016) pp. 97801S-1-97801S-6, vol. 9780.

(Continued)

*Primary Examiner* — Shamim Ahmed
(74) *Attorney, Agent, or Firm* — Tutunjian & Bitetto, P.C.; Randall Bluestone

(57) ABSTRACT

Integrated chips and methods of forming the same include forming a first set of sidewall spacers on a first mandrel at first vertical level. The first mandrel is etched away. A second set of sidewall spacers is formed on a second mandrel at a second vertical level. A portion of the second set of sidewall spacers vertically overlaps with a portion of the first set of sidewall spacers. The second mandrel is etched away. A first hardmask layer is etched, using the vertically overlapping first set of sidewall spacers and second set of sidewall spacers as a mask.

17 Claims, 7 Drawing Sheets

(56) References Cited

U.S. PATENT DOCUMENTS

2019/0157082 A1   5/2019  Fan et al.
2019/0318931 A1*  10/2019 Shu .................... H01L 23/5226
2020/0111668 A1*  4/2020  O'Toole ............ H01L 21/31111

OTHER PUBLICATIONS

Raley, A. et al., "Self-Aligned Blocking Integration Demonstration for Critical sub 40nm pitch Mx Level Patterning" Proceedings of SPIE (Apr. 2017) pp. 101490O-1-101490O-11, vol. 10149.
Briggs, B. et al., "N5 Technology Node Dual-Damascene Interconnects Enabled Using Multi Patterning" 2017 IEEE International Interconnect Technology Conference (IITC) (May 2017) pp. 1-3.
Drissi, Y. et al., "SALELE Process from Theory to Fabrication" Proceedings of SPIE (Mar. 2019) pp. 109620V-1-109620V-12, vol. 10962.

* cited by examiner

SPACER-ASSISTED LITHOGRAPHIC DOUBLE PATTERNING

BACKGROUND

The present invention generally relates to integrated chip fabrication and, more particularly, to fabrication of lines using lithographic processes.

In some processes that form lines, sidewalls are formed on a mandrel and are then used to pattern an underlying layer. However, due to imperfections in the deposition processes used to form the sidewalls, the corners of the resulting sidewall structures can be curved. When the outer edges of these sidewall structures are used for patterning additional structures, the additional structures can form "pinch points" at the ends of the mandrels, where they follow the curve of the sidewall structures. These pinch points result in increased parasitic capacitance. Additionally, pillars used to cut the mandrels can slump or otherwise depart from the intended design, causing device failure and lowered yield. Furthermore, because the mandrels can be patterned without a spacer, the mandrel lines can suffer from increased line edge roughness.

SUMMARY

A method of forming an integrated chip includes forming a first set of sidewall spacers on a first mandrel at first vertical level. The first mandrel is etched away. A second set of sidewall spacers is formed on a second mandrel at a second vertical level. A portion of the second set of sidewall spacers vertically overlaps with a portion of the first set of sidewall spacers. The second mandrel is etched away. A first hardmask layer is etched, using the vertically overlapping first set of sidewall spacers and second set of sidewall spacers as a mask.

A method of forming an integrated chip includes forming a first mandrel on a first hardmask layer. A first set of sidewall spacers is formed on the first mandrel. The first mandrel is etched away. A fill layer is formed over the first set of sidewall spacers. A second mandrel is formed over the fill layer. A second set of sidewall spacers is formed on the second mandrel. A portion of the second set of sidewall spacers vertically overlaps with a portion of the first set of sidewall spacers. The second mandrel is etched away. A first hardmask layer is etched, using the vertically overlapping first set of sidewall spacers and second set of sidewall spacers as a mask.

An integrated chip includes conductive lines on an underlying layer that include at least one cut in at least one conductive line. Each line neighboring a cut line lacks a pinch off structure at a position corresponding to the respective cut.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention perform lithographic double patterning on multiple layers to create a multi-layer mask. Because mandrels are formed on multiple layers, patterns can be formed without using the space outside of the mandrels' sidewall spacers, thereby preventing pinch points from forming and reducing parasitic capacitance. Additionally, mandrel cuts do not need a pillar process to pattern the cut location, so there is no risk of the pillar slumping or falling over. The sidewall spacers improve the line edge roughness, which reduces line resistance.

Figure 1:
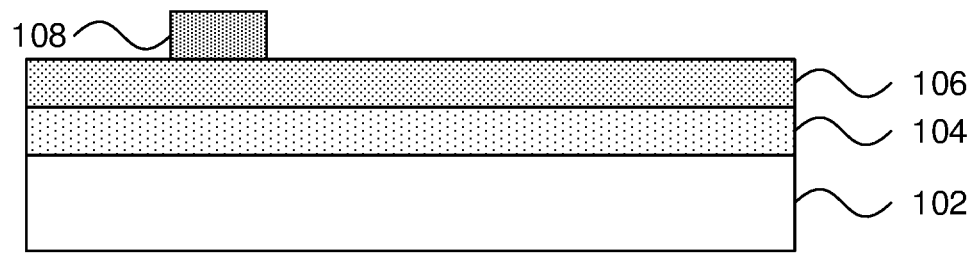
FIG. 1 is a cross-sectional view of a step in the fabrication of lines on an integrated chip, showing the formation of a mandrel above hardmask layers, on a first level, in accordance with an embodiment of the present invention.

Referring now to the drawings in which like numerals represent the same or similar elements and initially to FIG. 1, a cross-sectional view of a step in the formation of lines on an integrated chip is shown. A mandrel 108 is formed on a second hardmask layer 106, which is formed on a first hardmask layer 104, which is formed on a substrate 102.

The substrate 102 may be a layer of metal lines and interconnects or can, in other embodiments, be a layer that includes active electronic devices. Vias can provide an electric interface between the interconnects and devices in the substrate 102 and lines fabricated in the present embodiments.

The first hardmask layer 104 is formed from a first mask material, and can be formed on the semiconductor substrate 102 by any appropriate deposition process, such as chemical vapor deposition (CVD), physical vapor deposition (PVD), atomic layer deposition (ALD), or gas cluster ion beam (GCIB) deposition. The second hardmask layer 106 is formed from a second mask material, and can be formed on the first hardmask layer 104 by any appropriate deposition process, such as CVD, PVD, ALD, or GCIB deposition. An exemplary material that can be used for the first mask material includes titanium nitride. An exemplary material that can be used for the second mask material includes silicon nitride. It should be understood that these mask layers can be formed from any appropriate materials, but it is specifically contemplated that the first mask material and the second mask material are selectively etchable with respect to one another. As used herein, the term "selective" in reference to a material removal process denotes that the rate of material removal for a first material is greater than the rate of removal for at least another material of the structure to which the material removal process is being applied.

The mandrel 108 can be formed from a third mask material, and can be formed on the second hardmask layer 106 by depositing a layer using any appropriate process, such as CVD, PVD, ALD or GCIB deposition, followed by a lithographic etching process that defines a pattern for the layer and removes any of the third dielectric material outside of the pattern using an appropriate selective etch. The third dielectric material is selected to be selective to at least the second dielectric material, but can be the same as the first dielectric material. In some embodiments, the third mask material can include amorphous silicon.

The mandrel 108 can be patterned by applying a photoresist to the surface of the second hardmask layer 106. The photoresist layer can then be exposed to a pattern of radiation. A resist developer is then used to remove the material that does not belong in the pattern, leaving only the pattern material behind. It is specifically contemplated that a positive photoresist material can be used, which becomes soluble in the developer when exposed to, e.g., ultraviolet light or any other appropriate beam.

Figure 2:
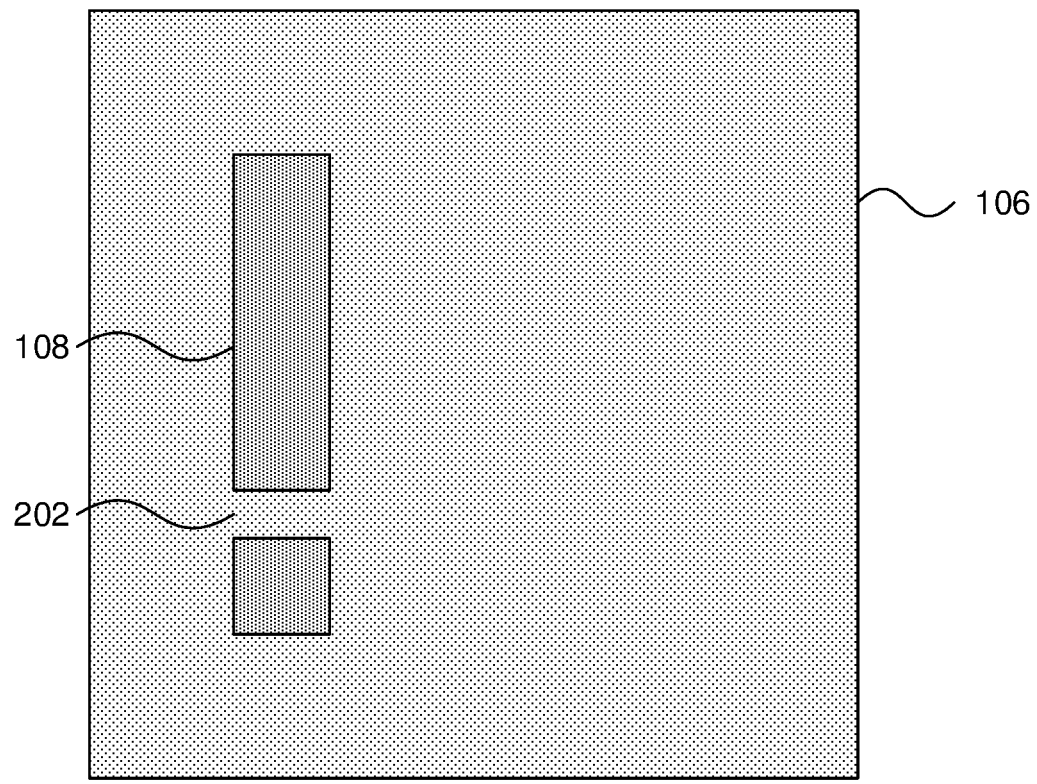
FIG. 2 is a top-down view of a step in the fabrication of lines on an integrated chip, showing the formation of a mandrel above hardmask layers, on the first level, in accordance with an embodiment of the present invention.

Referring now to FIG. 2, a top-down view of a step in the formation of lines on an integrated chip is shown. As can be seen from this perspective, a cut 202 can be formed in the mandrel 108 during the photolithographic patterning. The cut can be at less than or equal to the spacing between the lines to be formed. It should be understood that any appropriate number of cuts 202 can be formed in the mandrel 108.

Figure 3:
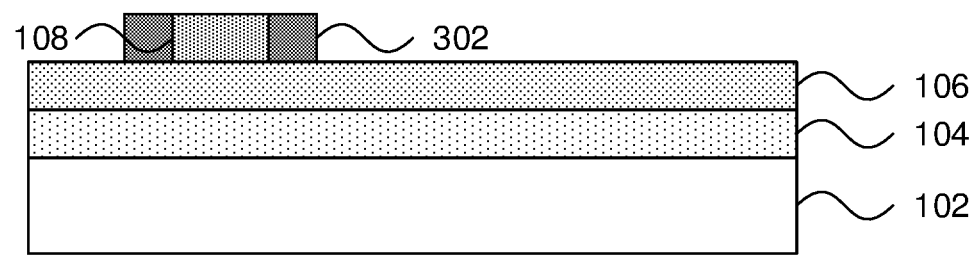
FIG. 3 is a cross-sectional view of a step in the fabrication of lines on an integrated chip, showing the formation of sidewall spacers on sidewalls of the mandrel, on the first level, in accordance with an embodiment of the present invention.

Referring now to FIG. 3, a cross-sectional view of a step in the formation of lines on an integrated chip is shown. First sidewall spacers 302 are formed on the sidewalls of the mandrel 108. The first sidewall spacers 302 can be formed by a conformal deposition process, such as CVD or ALD, which deposits a layer of spacer material that has a substantially even thickness on all of the exposed surfaces. A selective, anisotropic etch is then used to remove the spacer material from horizontal surfaces. In some embodiments, the anisotropic etch can be timed to leave the sidewall spacers 302. In other embodiments, the anisotropic etch can be halted after the top surface of the second hardmask layer 106 is exposed. The spacer material can be any appropriate fourth mask material that is selectively etchable with respect to the mandrel 108, the first hardmask layer 104, and the second hardmask layer 106. In some embodiments, the fourth mask material can include titanium dioxide.

Figure 4:
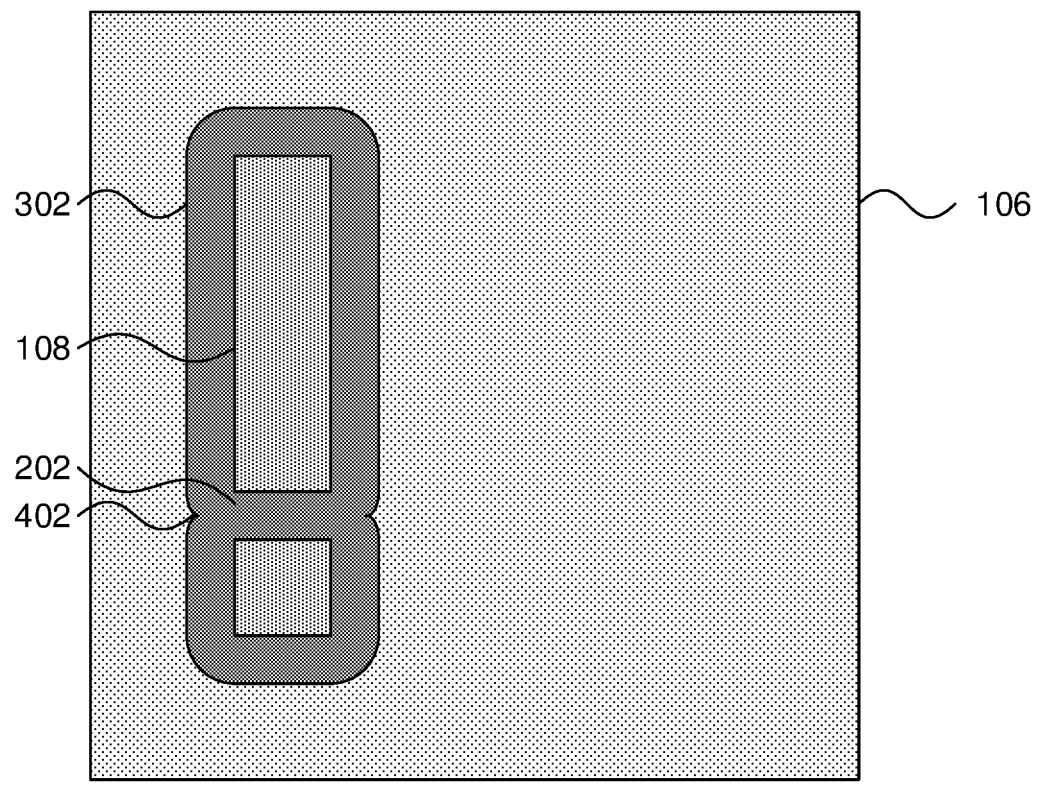
FIG. 4 is a top-down view of a step in the fabrication of lines on an integrated chip, showing the formation of sidewall spacers on sidewalls of the mandrel, on the first level, including dimples in the sidewall spacers at the mandrel cut points, in accordance with an embodiment of the present invention.

Referring now to FIG. 4, a top-down view of a step in the formation of lines on an integrated chip is shown. The first sidewall spacers 302 surround the mandrel 108 and fill the space in the mandrel cut 202. It should be noted that the first sidewall spacers 302 can have rounded corners, due to imperfections in the deposition process. These rounded corners result in dimples 402 at the mandrel cut 202. If the first sidewall spacers 302 were used to pattern lines both within their boundary, and outside their boundary, the lines outside the first sidewall spacers 302 would include complementary structure to the dimples 402 and would therefore include pinch points.

Figure 5:
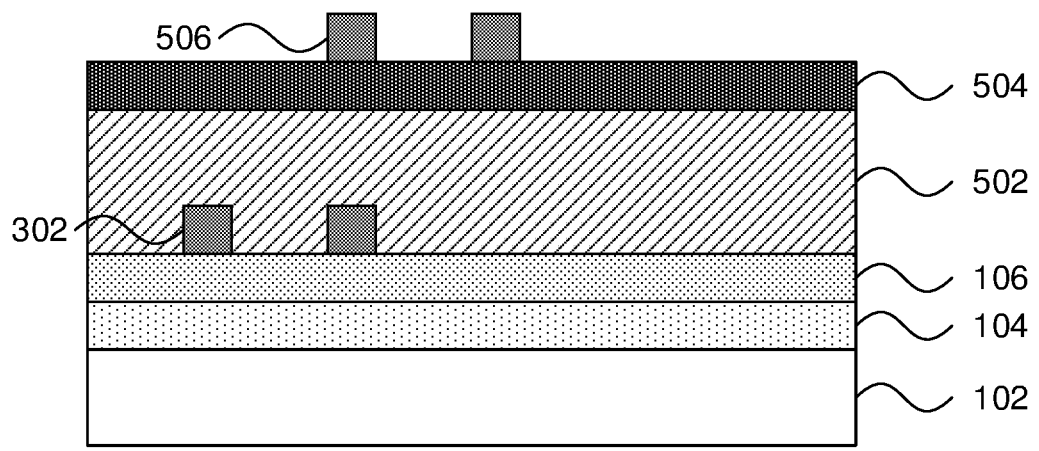
FIG. 5 is a cross-sectional view of a step in the fabrication of lines on an integrated chip, showing the formation of a mandrel above hardmask layers, on a second level, in accordance with an embodiment of the present invention.

Referring now to FIG. 5, a cross-sectional view of a step in the formation of lines on an integrated chip is shown. The mandrel 108 is etched away by any appropriately selective isotropic or anisotropic etch, leaving the sidewall spacers 302. A planarizing fill material is deposited to form first planarizing layer 502 over the sidewall spacers 302. In some embodiments, the planarizing fill material can be an organic plananarizing material, such as a photo-sensitive organic polymer that, when exposed to electromagnetic (EM) radiation, changes chemically to be removable by a developing solvent. Examples of photo-sensitive organic polymers may include polyacrylate resin, epoxy resin, phenol resin, polyamide resin, polyimide resin, unsaturated polyester resin, polyphenylenether resin, polyphenylenesulfide resin, or benzocyclobutene. More generally, the developable organic planarizing material may be formed from any organic polymer and a photo-active compound having a molecular structure that can attach to the molecular structure of the organic polymer. In other embodiments, the planarizing material may be glass. The planarizing material may, for example, be applied using spin coating technology or a flowable CVD process.

A third hardmask layer 504 is formed over the first planarizing layer 502 by any appropriate deposition process, such as CVD, ALD, PVD, or GCIB deposition. The third hardmask layer 504 can be formed from a fifth mask material that is selectively etchable with respect to at least the fourth mask material and the first mask material, such as silicon nitride. Second sidewall spacers 506 are formed on the third hardmask layer 504 from, e.g., the same fourth mask material as the first sidewall spacers 302, or any other appropriate material. The second sidewall spacers 506 can, for example, be formed by the process described above of forming a mandrel, conformally depositing the fourth mask material on exposed surfaces, and anisotropically etching the fourth mask material from horizontal surfaces. Notably, the second sidewall spacers 506 are formed to align, along at least one side, with a side of the first sidewall spacers 302.

Figure 6:
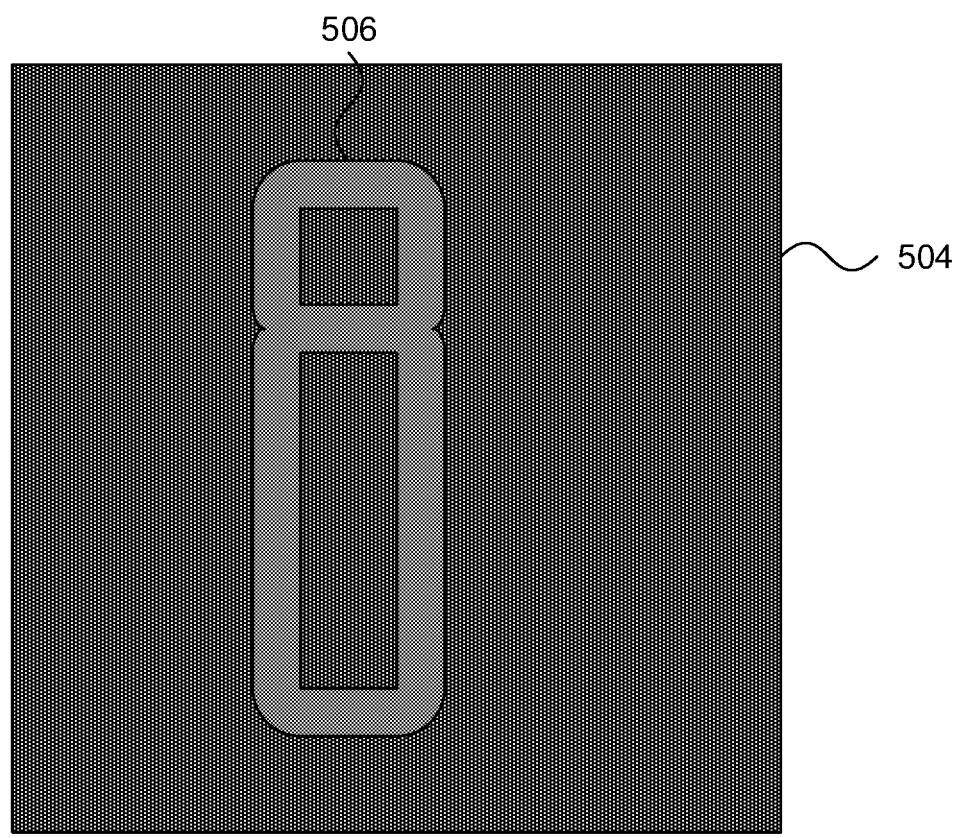
FIG. 6 is a top-down view of a step in the fabrication of lines on an integrated chip, showing the formation of a mandrel above hardmask layers, on a second level, in accordance with an embodiment of the present invention.

Referring now to FIG. 6, a top-down view of a step in the formation of lines on an integrated chip is shown. The second sidewall spacers 506 are shown on the third hardmask layer 504, being laterally displaced from the position of the underlying first sidewall spacers 302. It should be understood that this step can be repeated any number of times to form any number of layers, with the stacked sidewall spacers together forming a mask pattern. The cuts in the mandrel can be positioned in different places relative to those shown in FIG. 2, resulting in the second sidewall spacers 506 having a different internal configuration. As was shown in FIG. 4, the second sidewall spacers 506 also include dimples at the mandrel cuts.

Figure 7:
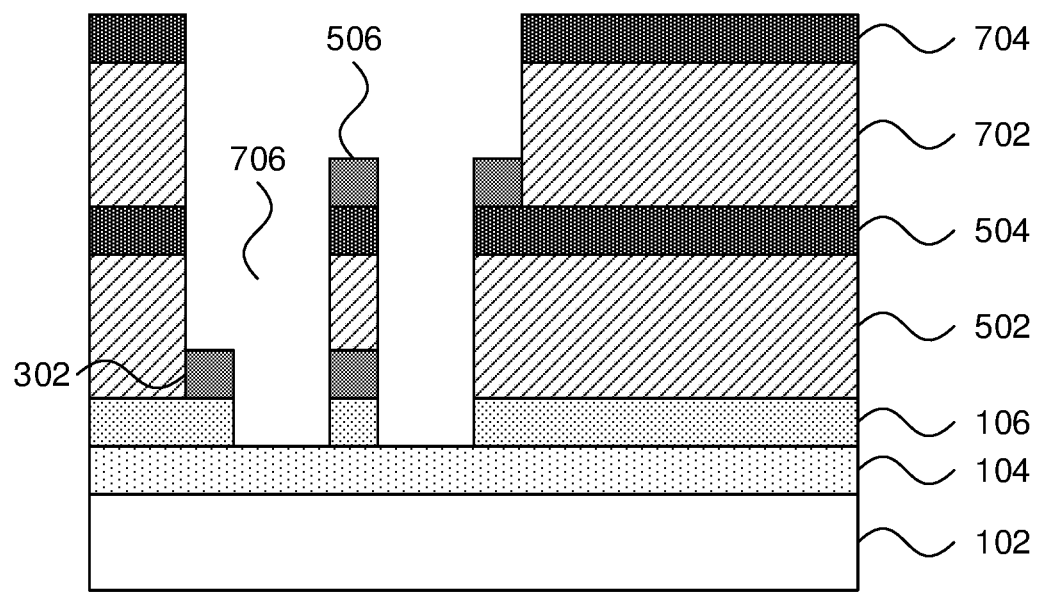
FIG. 7 is a cross-sectional view of a step in the fabrication of lines on an integrated chip, showing the use of the sidewall spacers on the first and second level as a combined mask in accordance with an embodiment of the present invention.

Referring now to FIG. 7, a cross-sectional view of a step in the formation of lines on an integrated chip is shown. A second planarizing layer 702 is formed over the third hardmask layer 504 by any appropriate deposition process, and may be formed from the same planarizing material as the first planarizing layer 502. A fourth hardmask layer 704 is formed over the second planarizing layer 702 by any appropriate deposition process. The fourth hardmask layer 704 can be formed from a sixth hardmask material, and in some embodiments can be formed from an ultraviolet-sensitive photoresist material. It is specifically contemplated that the sixth hardmask material can be silicon nitride.

An opening is formed in the fourth hardmask layer 704 using, for example, an ultraviolet beam. The opening is aligned with the various sidewall spacers, and one or more selective anisotropic etches are performed, using the fourth hardmask layer 704 as a pattern, to form opening 706. The second sidewall spacers 506 act as a mask for the underlying first planarizing layer 502. A portion of the second hardmask layer 106 is exposed by the opening 706. The exposed portion of the second hardmask layer 106 is then anisotropically etched away, exposing the surface of the first hardmask layer 104.

Figure 8:
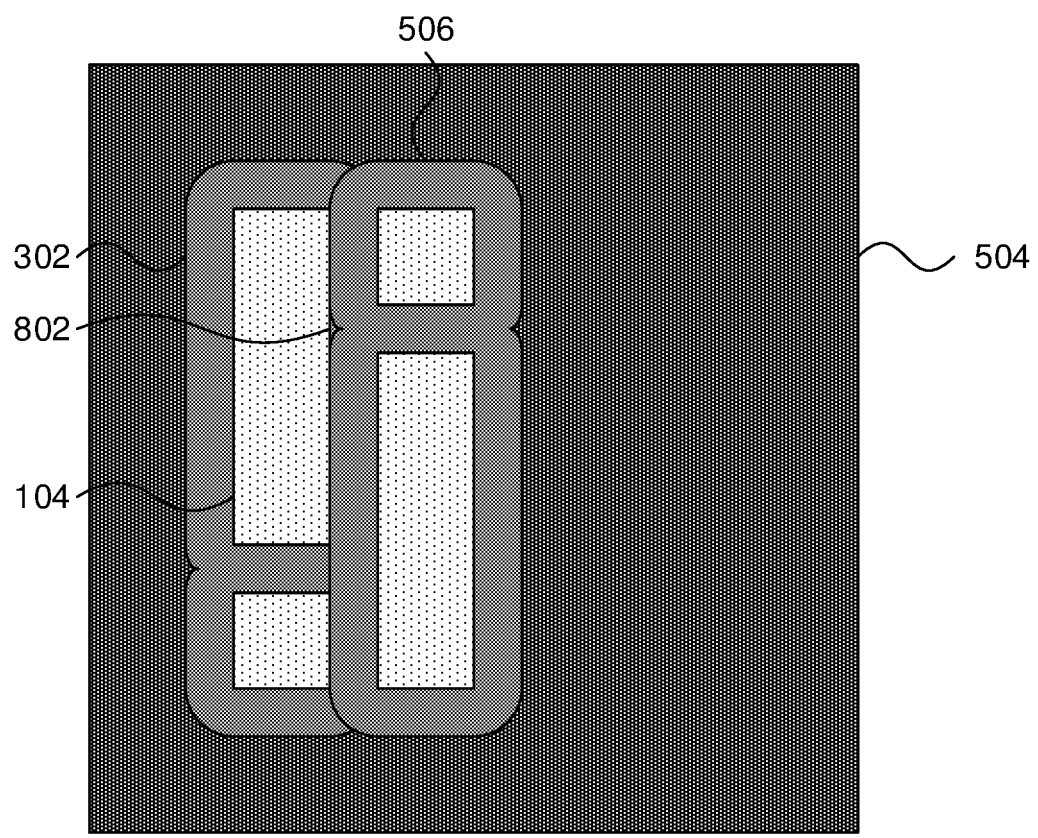
FIG. 8 is a top-down view of a step in the fabrication of lines on an integrated chip, showing the use of the sidewall spacers on the first and second level as a combined mask in accordance with an embodiment of the present invention.

Referring now to FIG. 8, a top-down view of a step in the formation of lines on an integrated chip is shown. The first sidewall spacers 302 and the second sidewall spacers 506 are shown as being visible in the opening 706, along with the top surface of the second hardmask layer 106.

Also shown is the partial overlap of the first sidewall spacers 302 and the second sidewall spacers 506. Because of the overlap of these spacers, particularly at the points 802 where dimples would be present at the mandrel cuts, no pinch points result between the exposed regions of the underlying first hardmask layer 104. It should be understood that any number of sidewall spacers can be formed in the manner described above, and that no pinch points will be formed in the resulting lines.

Figure 9:
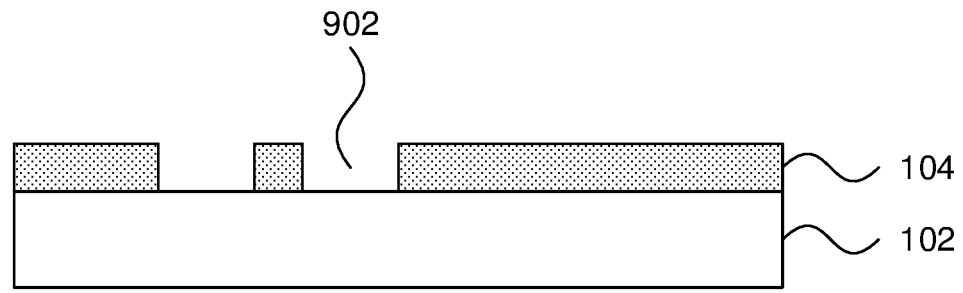
FIG. 9 is a cross-sectional view of a step in the fabrication of lines on an integrated chip, showing the exposure of a patterned hardmask layer in accordance with an embodiment of the present invention.

Referring now to FIG. 9, a cross-sectional view of a step in the formation of lines on an integrated chip is shown. After the pattern is transferred to the first hardmask layer 104, the overlying layers are all removed, exposing the first hardmask layer 104. The substrate 102 is exposed in the patterned lines 902.

One benefit of using the sidewall spacers of a mandrel to pattern lines is that the lines can be placed closer together than would otherwise be possible using a given photolithographic process. For example, while the spatial resolution of a photolithographic process is limited, in the present state of the art, to generate minimum feature sizes of about 50 nm, the sidewall spacers can be formed to arbitrary thicknesses, for example with a thickness between about 1 nm and about 50 nm. In some particular embodiments, the thickness can be formed to be between about 10 nm and about 20 nm. Thus, the spacing between the lines can be substantially smaller than the minimum feature size of the lithographic process being used.

Figure 10:
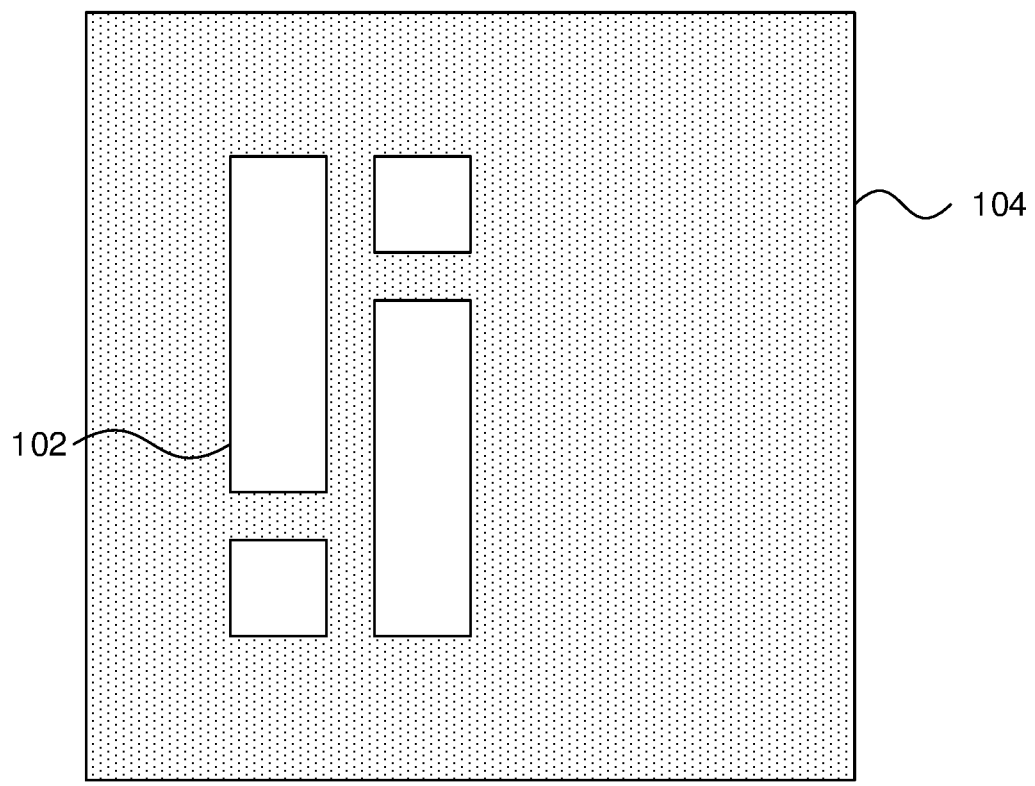
FIG. 10 is a top-down view of a step in the fabrication of lines on an integrated chip, showing the exposure of a patterned hardmask layer in accordance with an embodiment of the present invention.

Referring now to FIG. 10, a top-down view of a step in the formation of lines on an integrated chip is shown. No pinch points result between neighboring lines, due to the overlapping patterns of the sidewall spacers across multiple layers.

Figure 11:
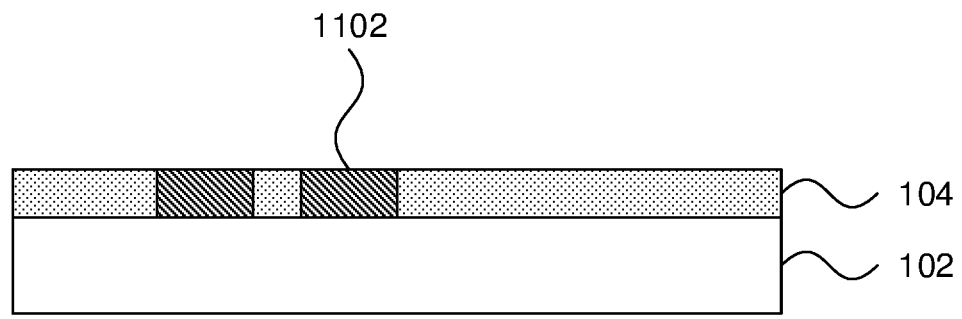
FIG. 11 is a cross-sectional view of a step in the fabrication of lines on an integrated chip, showing the formation of conductive lines using the patterned hardmask layer in accordance with an embodiment of the present invention.

Referring now to FIG. 11, a cross-sectional view of a step in the formation of lines on an integrated chip is shown. At this stage, conductive lines 1102 can be formed in the openings of the first hardmask layer 104 by, e.g., depositing conductive material by any appropriate process, such as CVD, ALD, PVD, or GCIB deposition, and then polishing down to the height of the first hardmask layer 104. These conductive lines can be formed from any appropriate conductive material and can make electrical contact with one or more structure in the underlying substrate 102. In this manner, a three dimensional integrated chip can be formed, with conductive lines providing indirect electrical communication between structures on a given level, and with vias providing communication between vertically adjacent levels.

The conductive lines 1102 may be formed from any appropriate conductive metal such as, e.g., tungsten, nickel, titanium, molybdenum, tantalum, copper, platinum, silver, gold, ruthenium, iridium, rhenium, rhodium, and alloys thereof. The conductive lines 902 may alternatively be formed from a doped semiconductor material such as, e.g., doped polysilicon.

Figure 12:
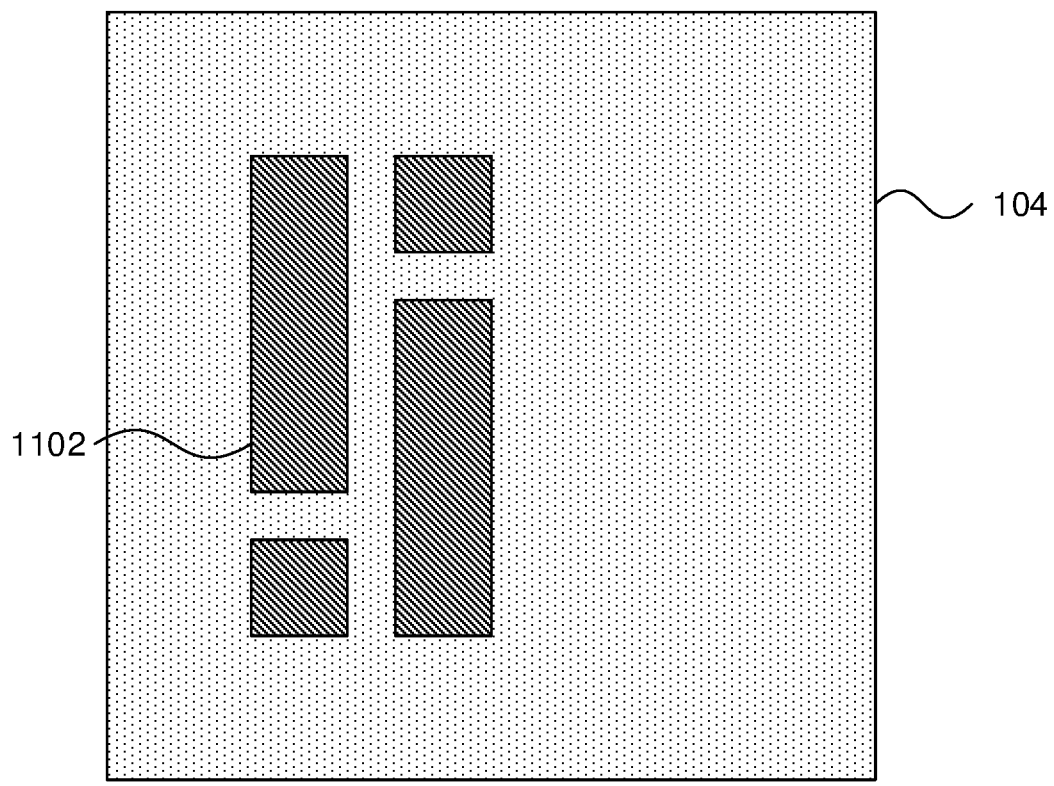
FIG. 12 is a top-down view of a step in the fabrication of lines on an integrated chip, showing the formation of conductive lines using the patterned hardmask layer in accordance with an embodiment of the present invention.

Referring now to FIG. 12, a top-down view of a step in the formation of lines on an integrated chip is shown. As shown in this view, no pinch points result between neighboring conductive lines 1102. This is a downstream result of using overlapping patterns of the sidewall spacers across multiple layers. Any imperfections at the corners of the sidewall structures are covered by an overlapping structure on another vertical level.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms ended to encompass orientations of the device in use or operation addition A the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 demes or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 13:
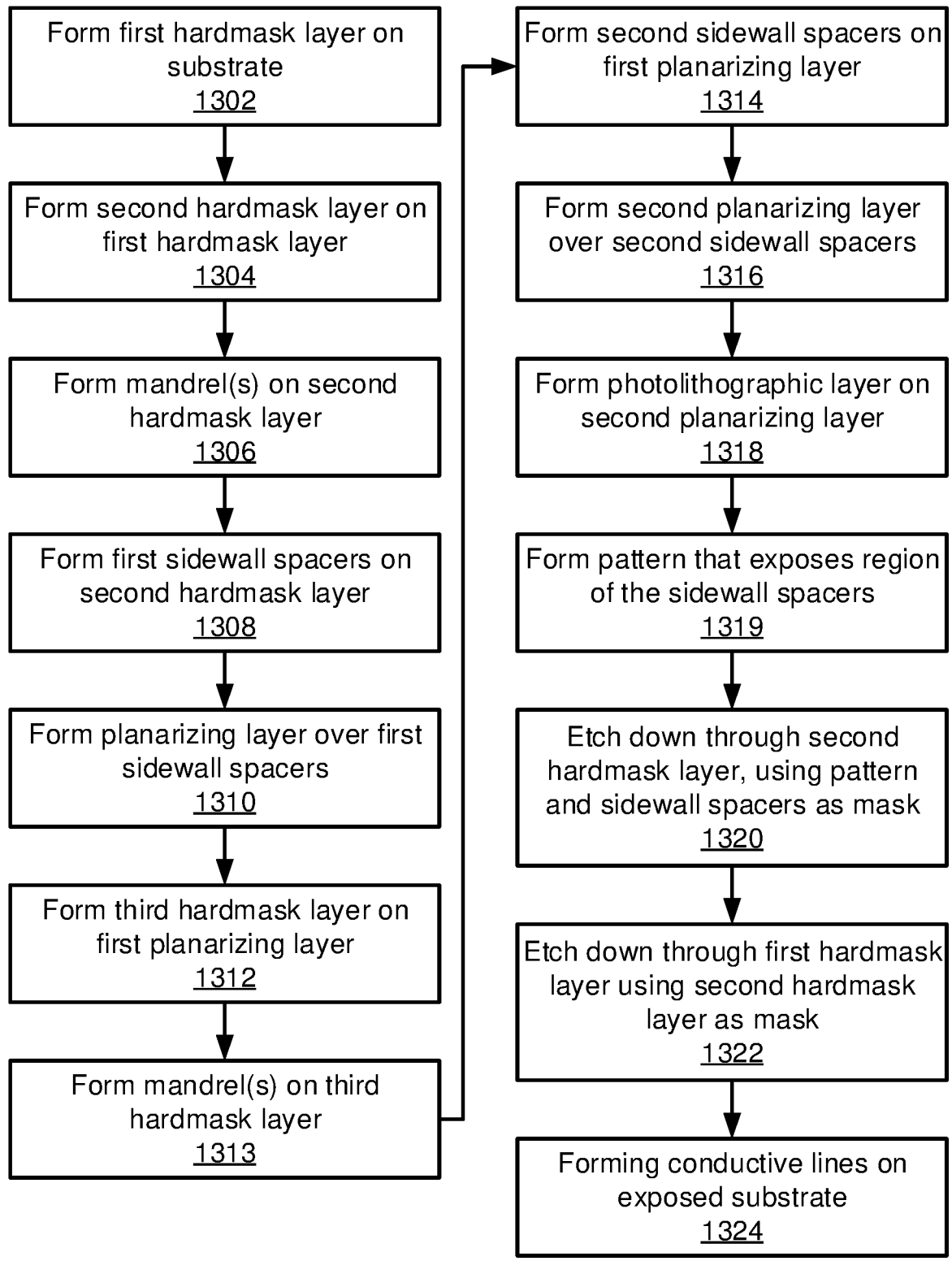
FIG. 13 is a block/flow diagram of a method of fabricating conductive lines in an integrated chip in accordance with an embodiment of the present invention.

Referring now to FIG. 13, a method for forming lines and fins in a substrate is shown. Block 1302 forms the first hardmask layer 104 on the substrate 102 by any appropriate deposition process, such as CVD, ALD, PVD, or GCIB deposition. Block 1304 forms the second hardmask layer 106 on the first hardmask layer by any appropriate deposition process. The first hardmask layer 104 and the second hardmask layer 106 are formed from different, selectively etchable materials.

Block 1306 forms one or more mandrels 108 on the second hardmask layer 106. The formation of the mandrels 108 can include deposition of a layer of mandrel material, followed by photolithographic patterning, and can include the formation of cuts 202 in the mandrels 108. Block 1308 forms first sidewall spacers 302 on the sidewalls of the mandrels 108, for example using a conformal deposition process, followed by a selective, anisotropic etch that removes the spacer material from horizontal surfaces.

Block 1310 forms a first planarizing layer 502 over the first sidewall spacers 302 by, for example, a spin-on process or flowable CVD. A third hardmask layer 504 is then deposited over the first planarizing layer 502 in block 1312 by any appropriate process, and a second set of sidewall spacers 506 is formed on the third hardmask layer 504 in block 1314, for example by the process described above. It is specifically contemplated that the second spacers 506 will vertically overlap with part of the first sidewall spacers 302.

Block 1316 forms second planarizing layer 702 over the second sidewall spacers 506 and block 1318 forms a photolithographic layer 704 on the second planarizing layer 702. Block 1319 exposes the photolithographic layer 704 to form a mask over the first sidewall spacers 302 and the second sidewall spacers 506. One or more anisotropic etches are used in block 1320 to form opening 706 in the second planarizing layer 702, the third hardmask layer 504, the first planarizing layer 502, and the second hardmask layer 106.

Block 1322 then anisotropically etches down through the first hardmask layer 104 using the opening in the second hardmask layer 106 as a mask to expose a portion of the underlying substrate 102. Because the vertically arranged sidewall spacers form a single, combined pattern under the anisotropic etch, the resulting pattern in the second hardmask layer 106 and the first hardmask layer 104 does not include pinch points and has improved line edge roughness, as imperfections in the outer surface of any sidewall spacer are compensated for by an inner surface of a vertically displaced sidewall spacer.

Having described preferred embodiments of spacer-assisted lithographic double patterning (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming lines in integrated chip, comprising:
    forming a first set of sidewall spacers on a first mandrel at first vertical level;
    etching away the first mandrel;
    forming a second set of sidewall spacers on a second mandrel at a second vertical level, wherein a portion of the second set of sidewall spacers vertically overlaps with a portion of the first set of sidewall spacers;
    etching away the second mandrel; and
    etching a first hardmask layer, using the vertically overlapping first set of sidewall spacers and second set of sidewall spacers as a mask.

2. The method of claim 1, further comprising depositing a first planarizing layer over the first set of sidewall spacers, after etching away the first mandrel.

3. The method of claim 2, further comprising forming a second hardmask layer over the first planarizing layer, before forming the second set of sidewall spacers.

4. The method of claim 3, further comprising forming a second planarizing layer over the second set of sidewall spacers, after etching away the second mandrel.

5. The method of claim 4, further comprising forming, a photoresist pattern over the second planarizing layer with an opening over the first set sidewall spacers and the second set of sidewall spacers.

6. The method of claim 5, further comprising etching the second planarizing layer, the second hardmask layer, and the first planarizing layer using one or more selective anisotropic etches that do not remove the first set of sidewall spacers and the second set of sidewall spacers.

7. The method of claim 1, further comprising forming the first mandrel on the first hardmask layer, including at least one cut in the first mandrel.

8. The method of claim 7, further comprising forming the second mandrel, including at least one cut in the second mandrel.

9. The method of claim 1, forming conductive lines on an underlying substrate in areas exposed by the first hardmask layer.

10. A method for forming lines in an integrated chip, comprising:
    forming a first mandrel on a first hardmask layer;
    forming a first set of sidewall spacers on the first mandrel;
    etching away the first mandrel;
    forming a fill layer over the first set of sidewall spacers;
    forming a second mandrel over the fill layer;
    forming a second set of sidewall spacers on the second mandrel, wherein a portion of the second set of sidewall spacers vertically overlaps with a portion of the first set of sidewall spacers;
    etching away the second mandrel; and
    etching a first hardmask layer, using the vertically overlapping first set of sidewall spacers and second set of sidewall spacers as a mask.

11. The method of claim 10, further comprising forming a second hardmask layer over the fill layer, before forming the second set of sidewall spacers.

12. The method of claim 11, further comprising forming a second fill layer over the second set of sidewall spacers, after etching away the second mandrel.

13. The method of claim 12, further comprising forming a photoresist pattern over the second fill layer, with an opening over the first set sidewall spacers and the second set of sidewall spacers.

14. The method of claim 13, further comprising etching the second fill layer, the second hardmask layer, and the first fill layer using one or more selective anisotropic etches that do not remove the first set of sidewall spacers and the second set of sidewall spacers.

15. The method of claim 11, wherein the first mandrel includes at least one cut.

16. The method of claim 15, wherein the second mandrel includes at least one cut.

17. The method of claim 11, forming conductive lines on an underlying substrate in areas exposed by the first hardmask layer.

* * * * *